US012665170B2

(12) United States Patent
Choi et al.

(10) Patent No.: US 12,665,170 B2
(45) Date of Patent: Jun. 23, 2026

(54) SUBSTRATE TREATING APPARATUS AND SUBSTRATE TREATING METHOD

(71) Applicant: SEMES CO., LTD., Chungcheongnam-do (KR)

(72) Inventors: Yoon Seok Choi, Chungcheongnam-do (KR); Yun Sang Kim, Chungcheongnam-do (KR); Youn Gun Bong, Chungcheongnam-do (KR); Jae Won Shin, Chungcheongnam-do (KR); Jong Won Park, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 340 days.

(21) Appl. No.: 18/135,740

(22) Filed: Apr. 18, 2023

(65) Prior Publication Data

US 2023/0369021 A1 Nov. 16, 2023

(30) Foreign Application Priority Data

May 16, 2022 (KR) ........................ 10-2022-0059708

(51) Int. Cl.
*H01J 37/32* (2006.01)

(52) U.S. Cl.
CPC .... *H01J 37/3222* (2013.01); *H01J 37/32192* (2013.01); *H01J 37/32229* (2013.01); *H01J 37/32238* (2013.01); *H01J 37/32568* (2013.01); *H01J 37/32633* (2013.01); *H01J 2237/334* (2013.01)

(58) Field of Classification Search
CPC ............. H01J 37/3222; H01J 37/32091; H01J 37/321; H01J 37/32192–32311; H01J 37/32532–32614
See application file for complete search history.

(56) References Cited

U.S. PATENT DOCUMENTS

| | | | | | |
|---|---|---|---|---|---|
| 5,685,949 | A | * | 11/1997 | Yashima | ........... H01J 37/32082 134/1.1 |
| 6,076,484 | A | * | 6/2000 | Matsumoto | ....... H01J 37/32192 118/723 MR |
| 6,290,807 | B1 | * | 9/2001 | Matsumoto | ....... H01J 37/32192 204/298.38 |
| 6,358,361 | B1 | * | 3/2002 | Matsumoto | ........... C23C 16/511 204/298.38 |

(Continued)

FOREIGN PATENT DOCUMENTS

| | | |
|---|---|---|
| JP | 4062928 | 1/2008 |
| JP | 2015-70045 | 4/2015 |

(Continued)

*Primary Examiner* — Aiden Lee
(74) *Attorney, Agent, or Firm* — WOMBLE BOND DICKINSON (US) LLP

(57) ABSTRACT

A substrate treating apparatus is provided to provide heating and plasma treatment of a substrate in a single device, and the substrate treating apparatus includes a treatment container in which a substrate is accommodated, a support member supporting the substrate in the treatment container, a plasma providing unit including an electrode generating plasma within the treatment container, and a microwave introducing unit connected to a microwave generating unit and introducing microwaves into the treatment container.

9 Claims, 10 Drawing Sheets

1

(56) References Cited

U.S. PATENT DOCUMENTS

| | | | | |
|---|---|---|---|---|
| 2004/0261720 A1* | 12/2004 | Tolmachev | ........... | H01J 37/321 118/723 MW |
| 2005/0082004 A1* | 4/2005 | Kasai | ...................... | H01Q 1/40 156/345.41 |
| 2005/0148167 A1* | 7/2005 | Hongoh | ............ | H01J 37/32192 257/E21.259 |
| 2007/0257009 A1* | 11/2007 | Chandrachood | ...... | H01J 37/321 216/67 |
| 2008/0283507 A1* | 11/2008 | Kitagawa | .............. | H01J 37/321 219/121.36 |
| 2013/0302992 A1* | 11/2013 | Nozawa | ............. | H01J 37/32211 438/758 |
| 2015/0179408 A1 | 6/2015 | Shimomura et al. | | |
| 2017/0133202 A1* | 5/2017 | Berry, III | ............ | H01J 37/3222 |
| 2017/0250058 A1* | 8/2017 | Kikuchi | .................. | C23C 16/455 |
| 2022/0084838 A1 | 3/2022 | Zhang et al. | | |
| 2024/0339299 A1* | 10/2024 | Choi | ................. | H01J 37/32229 |

FOREIGN PATENT DOCUMENTS

| | | |
|---|---|---|
| KR | 10-2015-0075380 | 7/2015 |
| KR | 10-2021-0105439 | 8/2021 |

* cited by examiner

SUBSTRATE TREATING APPARATUS AND SUBSTRATE TREATING METHOD

CROSS-REFERENCE TO RELATED APPLICATION(S)

This application claims benefit of priority to Korean Patent Application No. 10-2022-0059708 filed on May 16, 2022 in the Korean Intellectual Property Office, the disclosure of which is incorporated herein by reference in its entirety.

BACKGROUND

1. Field

The present disclosure relates to a substrate treating apparatus and a substrate treating method.

2. Description of Related Art

In general, processes for manufacturing a semiconductor device include a deposition process for forming a film on a semiconductor wafer (hereinafter, referred to as a substrate), a chemical/mechanical polishing process for planarizing the film, a photolithography process for forming a photoresist pattern on the film, an etching process for forming the film into a pattern having electrical characteristics using the photoresist pattern, an ion implantation process for implanting specific ions into a predetermined region of the substrate, a cleaning process for removing impurities on the substrate, and an inspection process for inspecting a surface of the substrate on which the film or pattern is formed.

The etching process is a process for removing an exposed region of the photoresist pattern formed on the substrate by the photolithography process. In general, the type of etching process may be divided into dry etching and wet etching.

In the dry etching process, high-frequency power is applied to upper and lower electrodes installed at a predetermined interval in a sealed internal space in which the etching process is performed to form an electric field, and an electric field is applied to a reactive gas supplied into the sealed space to activate the reactive gas to form a plasma state, and then, a substrate in which ions in plasma are located on the lower electrode is etched.

Meanwhile, as the pattern of the semiconductor is miniaturized, atomic layer etching may be considered. In the case of atomic layer etching, the surface of the substrate is reformed with plasma and then heated to remove the reformed surface layer. Atomic layer etching is advantageous in that a desired thickness may be accurately removed and depth uniformity is good, but since a plasma treatment and heating should be performed in cycles, it takes a long process time, such as moving the substrate to a heating device and a plasma treating device, thereby lowering productivity.

(Patent document 1) KR 10-2021-0105439 A

SUMMARY

Exemplary embodiments provide a substrate treating apparatus and method capable of providing heating and plasma treatment of a substrate in a single device.

According to an aspect of the present disclosure, a substrate treating apparatus and a substrate treating method are provided.

In an embodiment, a substrate treating apparatus includes: a treatment container in which a substrate is accommodated; a support member supporting the substrate in the treatment container; a plasma providing unit including an electrode generating plasma within the treatment container; and a microwave introducing unit connected to a microwave generating unit and introducing microwaves into the treatment container.

The microwave introducing unit may include a microwave antenna, and the microwave antenna may be disposed to be spaced apart from the electrode of the plasma providing unit.

The electrode may include an upper electrode located above the substrate in the treatment container and connected to a power source, the microwave antenna may be located above the upper electrode, and an insulator formed of a microwave transmissive material may be disposed between the upper electrode and the microwave antenna.

The upper electrode may be a transparent electrode, and a transmission window formed of a microwave transmissive material, on which the upper electrode is seated, may be disposed below the upper electrode.

The microwave introducing unit may further include a waveguide and a waveguide shaft connected to the microwave antenna, the microwave antenna may have a disk shape, an outer edge of the microwave antenna in a radial direction may be connected to the treatment container to be grounded, and a plurality of slots may be formed in the microwave antenna.

The microwave antenna may be formed in a ring shape surrounding the electrode when viewed in a first direction, perpendicular to a treatment surface of the substrate.

In an embodiment, a substrate treating apparatus includes: a treatment container in which a substrate is accommodated; a support member supporting the substrate in the treatment container; a plasma providing unit including an electrode disposed above the substrate and connected to a power source to form plasma in the treatment container; a microwave introducing unit connected to the microwave generating unit and including an antenna introducing microwaves into the treatment container; a gas supply unit introducing a treatment gas into the treatment container; and a discharge unit discharging gas inside the treatment container, wherein the treatment container includes an upper surface, a side surface, a baffle, and a support frame protruding inwardly from the side surface, a transmission window is at least partially supported on the support frame, allows the upper electrode to be seated on an upper surface thereof, and is formed of a microwave transmissive material, and the microwave antenna is disposed to be spaced apart from the electrode above the substrate.

In an embodiment, a substrate treating method using a substrate treating apparatus including a treatment container in which a substrate is accommodated; a support member supporting the substrate in the treatment container; a plasma providing unit including an electrode generating plasma within the treatment container; and a microwave introducing unit connected to a microwave generating unit and introducing microwaves into the treatment container, includes: a substrate supply operation of supplying the substrate; a first substrate treating operation of reforming a surface through the plasma providing unit; and a second substrate treating operation of heating the substrate through the microwave introducing unit to remove the reformed surface.

The first substrate treating operation and the second substrate treating operation may be performed alternately, and a treatment condition adjusting operation of adjusting at least an atmospheric pressure inside the treatment container is performed between the first substrate treating operation and the second substrate treating operation so that an atmospheric pressure inside the treatment container in the first substrate treating operation is different from an atmospheric pressure inside the treatment container in the second substrate treating operation.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
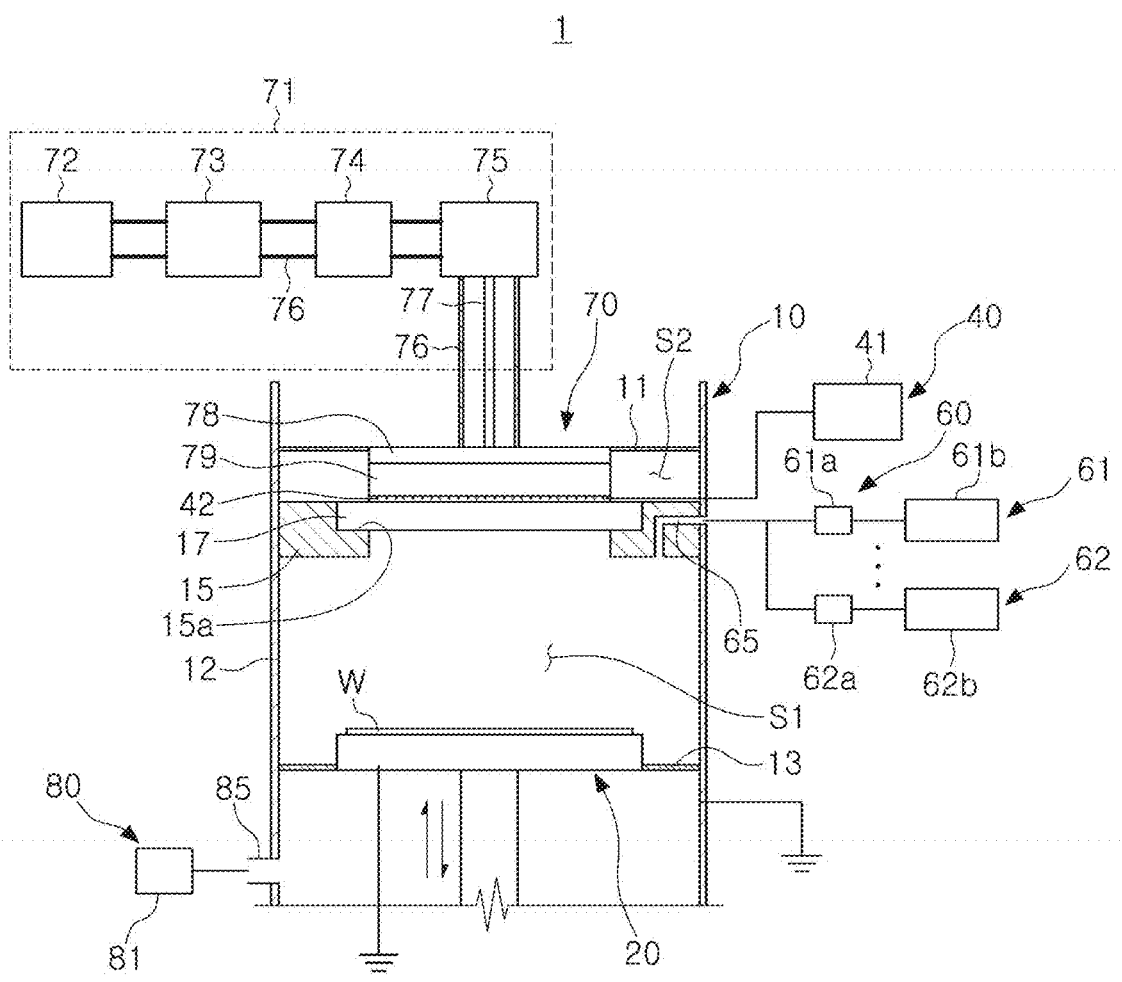
FIG. 1 is a schematic diagram of a substrate treating apparatus according to a first exemplary embodiment in the present disclosure.

Hereinafter, exemplary embodiments will be described in detail with reference to the accompanying drawings such that they may be easily practiced by those skilled in the art to which the present disclosure pertains. In describing the present disclosure, if a detailed explanation for a related known function or construction is considered to unnecessarily divert the gist of the present disclosure, such explanation will be omitted but would be understood by those skilled in the art. Also, similar reference numerals are used for the similar parts throughout the specification. In this disclosure, terms, such as "above", "upper portion", "upper surface", "below", "lower portion", "lower surface", "lateral surface", and the like, are determined based on the drawings, and in actuality, the terms may be changed according to a direction in which a device or an element is disposed.

It will be understood that when an element is referred to as being "connected to" another element, it may be directly connected to the other element or intervening elements may also be present. In contrast, when an element is referred to as being "directly connected to" another element, no intervening elements are present. In addition, unless explicitly described to the contrary, the word "comprise" and variations, such as "comprises" or "comprising," will be understood to imply the inclusion of stated elements but not the exclusion of any other elements.

Figure 2:
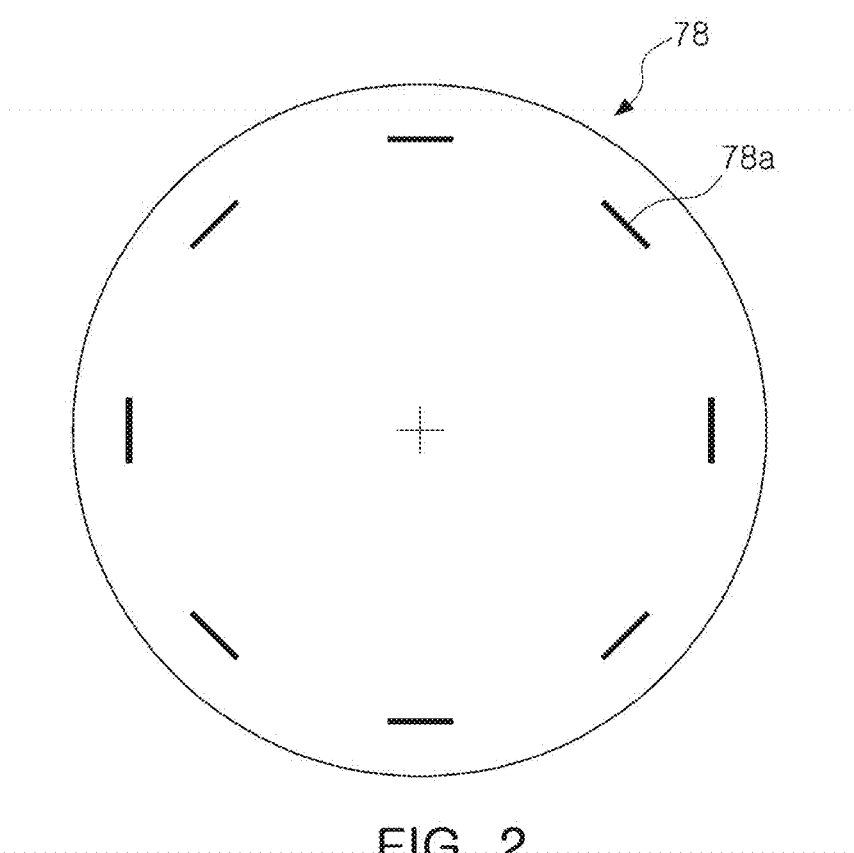
FIG. 2 is a plan view of a microwave antenna in the first exemplary embodiment in the present disclosure.

FIG. 1 is a schematic diagram of a substrate treating apparatus 1 according to a first exemplary embodiment in the present disclosure, and FIG. 2 is a plan view of a microwave antenna 78 of the substrate treating apparatus 1.

As shown in FIG. 1, the substrate treating apparatus 1 according to the first exemplary embodiment in the present disclosure includes a treatment container 10 in which a substrate W is accommodated, a support member 20 supporting the substrate W in the treatment container 10, a plasma providing unit 40 including an electrode 42 forming plasma in the treatment container 10, and a microwave introducing unit 70 connected to a microwave generating unit 71 and introducing a microwave into the treatment container 1.

The treatment container 10 includes an upper surface 11, a side surface 12, and a baffle 13 on a lower side to form a treatment space S1 in which a treatment is performed on the substrate W when the substrate W is accommodated therein. The treatment container 10 may be formed of a metal material so that when microwaves are introduced into the treatment container 10, microwaves may be reflected from the inside not to escape to the outside. The treatment container 10 is connected to the microwave introducing unit 70 and is grounded, so that the microwave introducing unit 70 is grounded through the treatment container 10. In the present exemplary embodiment, the treatment container 10 is in contact with the microwave introducing unit 70 at an upper surface thereof.

The treatment container 10 includes a support frame 15 connected to the side surface 12, and the support frame 15 has a hollow circular or prismatic annular shape and has a protrusion 15a so that a transmission window 17 is caught by the protrusion 15a. The support frame 15 may be formed of a material through which the microwaves may pass, for example, ceramic, quartz, or microwave-transmissive plastic. In the present exemplary embodiment, the support frame 15 is formed of ceramic.

The transmission window 17 is configured to support the electrode 42 of the plasma providing unit 40 and the microwave antenna 78 of the microwave introducing unit 70, and the transmission window 17 may be formed of a material allowing microwaves to pass therethrough, similar to the support frame 15, and in the present exemplary embodiment, the transmission window 17 is formed of quartz. Since the transmission window 17 and the support frame 15 face the treatment space S1, the transmission window 17 and the support frame 15 may be formed of a material securing heat resistance as well.

The support member 20 supports the substrate W inside the treatment container 10, has a size corresponding to the substrate W, and has a structure movable in a vertical direction. The baffle 13 of the treatment container 10 may be disposed below the support member 20.

The plasma providing unit 40 includes an RF generator 41 as a power source and an electrode 42 connected to the RF generator 41. In the present exemplary embodiment, the electrode 42 is disposed above the substrate W, and thus, the electrode 42 may also be referred to as an upper electrode. In a state in which a treatment gas is introduced into the treatment space S1 and the support member 20 is grounded, the RF generator 41 supplies an RF bias to the electrode 42, so that plasma is formed in the treatment space S1 in a capacity coupled plasma (CCP) manner, and the substrate W may be treated with the plasma formed in the treatment space S1.

The electrode 42 of the plasma providing unit 40 is seated on an upper surface of the transmission window 17 above the substrate W, and is formed of a transparent electrode, for example, a material, such as indium tin oxide (ITO). Transparent electrode is conductive, and allows a portion of microwaves to be transmitted therethrough depending on film quality and reflect another portion thereof. Even if a portion of the microwaves is reflected by the electrode 42, the microwaves may be reflected by the microwave antenna 78 formed of a metal material, the upper surface 11, and the side surface 12 and may be provided to the treatment space S1.

The gas supply unit 60 supplies a treatment gas into the treatment container 10 and includes a plurality of treatment gas supply sources 61 and 62 including treatment gas sources 61b and 62b and valves 61a and 62a respectively connected to the treatment gas sources 61b and 62b and a gas supply pipe 65 through which the treatment gas is introduced into the treatment container 10. The gas supply pipe 65 may be connected to the inside of the treatment container 10 through the support frame 15, but is not limited thereto, and the gas supply pipe 65 may also be connected to the inside of the treatment container 10 through the side surface 12 or through the baffle 13.

The microwave introducing unit 70 includes the microwave generating unit 71 and the microwave antenna 78 connected to the microwave generating unit 71. The microwave generating unit 71 includes a microwave generator 72, an isolator 73, a matching circuit 74, a mode converter 75, and a waveguide 76 connecting these elements. In the present exemplary embodiment, the microwave generating unit 71 has been described as including a component transmitting the microwaves generated by the microwave generator 72 to the mode converter 75, but the microwave generating unit 71 may include only the microwave generator 72.

In the present exemplary embodiment, the microwaves generated by the microwave generating unit 71 and converted into a TEM mode by the mode converter 75 may be transferred to the microwave antenna 78 through the waveguide 76 connecting the converter 75 to the microwave antenna 78 and a waveguide shaft 77, and the microwave is introduced into the treatment container 10 through the microwave antenna 78. Here, the microwave antenna 78 does not mean only members other than the waveguide 76 and may include a component that transmits microwaves into the treatment container 10, for example, a structure in which a slot is formed to be adjacent to an end portion of the waveguide 76.

FIG. 2 shows a plan view of the microwave antenna 78. As shown in FIG. 2, the microwave antenna 78 may be a disk formed of a conductive material, and a plurality of slots 78a are formed in the microwave antenna 78. The plurality of slots 78a may be formed in a circumferential direction of the microwave antenna 78, and an interval between the slots 78a may be $\lambda g$. Here, $\lambda g$ is a wavelength of the microwave in the waveguide 76. Microwaves are radiated into the treatment container 10 through the slot 78a of the microwave antenna 78. In the present exemplary embodiment, a plurality of slots 78a are formed in the circumferential direction, but a shape, number, and arrangement of the slots 78a may be changed as needed.

The microwave antenna 78 is in contact with the upper surface 11 of the treatment container 10 at an outer edge in a radial direction, and since the treatment container 10 is grounded, the microwave antenna 78 is also grounded through the upper surface 11.

Meanwhile, the microwave antenna 78 and the electrode 42 of the plasma providing unit 40 are spaced apart from each other in a vertical direction.

A simulator 79 is disposed between the microwave antenna 78 and the electrode 42 to electrically separate the microwave antenna 78 and the electrode 42 from each other. As the insulator 79, a material capable of insulating, while allowing the microwave to be transmitted therethrough, for example, quartz, ceramic, or microwave-transmissive plastic, may be applied.

Therefore, the microwave antenna 78 and the electrode 42 are electrically separated from each other, and the electrode 42 is formed as a transparent electrode to allow microwaves introduced through the microwave antenna 78 to be transmitted therethrough and easily supplied into the treatment container.

An upper space S2 is formed by the upper surface 11 and the side surface 12 and the support frame 15 outside the microwave antenna 78 and the insulator 79. Since the upper space S2 is formed without any special pressure control, the upper space S2 has an atmospheric pressure of 1 atm, and therefore, plasma may not be formed even if microwaves are supplied by the microwave antenna 78.

Meanwhile, although not shown, a discharge unit 80 through which gas is discharged is connected to the side surface 12 or a lower surface below the baffle 13 in the treatment container 10. The discharge unit 80 includes a discharge pipe 85 and a valve 81 allowing or preventing connection between the discharge pipe 85 and an exhaust system. The discharge unit 80 discharges a treatment gas inside the treatment container 10 externally, and performs a function of adjusting air pressure of the treatment space S1.

In the present exemplary embodiment, the substrate treating apparatus 1 includes the plasma providing unit 40 forming plasma into the treatment container 10 and the microwave introducing unit 70 introducing microwaves, so that the substrate W disposed inside the treatment container 10 of the substrate treating apparatus 1 is reformed through plasma and a reformed layer may be heated to be removed through microwaves, and therefore, a treatment gas may be supplied and discharged without moving the substrate W and an atomic layer removal may be achieved through selective utilization of the plasma providing unit 40 and the microwave introducing unit 70, thereby reducing a tap time and applying the atomic layer removal to mass production. In addition, there is no need to provide each of heating and plasma treatment equipment, providing advantages in terms of space.

Although the electrode 42 of the plasma providing unit 40 is disposed below the antenna 78 of the microwave introducing unit 70, when a transparent electrode is used as the electrode 42, it is easy to introduce microwaves into the treatment container 10, thereby facilitating heating of the substrate W through the microwave and enabling uniform heating.

In the present exemplary embodiment, the substrate treating apparatus 1 supplies a treatment gas for plasma reforming through the gas supply unit 60 and the discharge unit 80 in a state in which the substrate W is supplied, and after pressure of the treatment space S2 is adjusted to several tens to hundreds of mm Torr to form plasma, power may be supplied to the plasma providing unit 40 to perform reforming on the surface of the substrate W through plasma.

In addition, when the surface reforming of the substrate W is completed, a reactive gas, which is a treatment gas, is supplied into the treatment container 10 through the gas supply unit 60 and the discharge unit 80, and pressure in the treatment space S1 is adjusted to a high vacuum, for example, $10^{-4}$ Torr level or atmospheric pressure level in which plasma is not formed by microwaves. In this state, the substrate W may be heated by operating the microwave introducing unit 70 to remove the atomic layer on the reformed surface of the substrate W.

Figure 3:
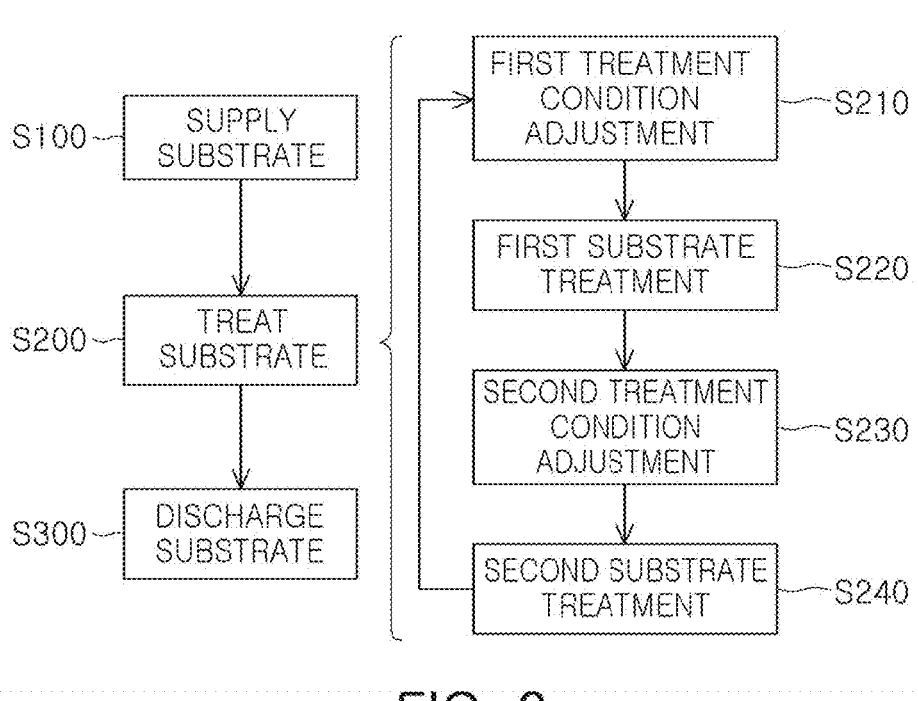
FIG. 3 is a flowchart of a substrate treating method according to an exemplary embodiment in the present disclosure.
Figure 4:
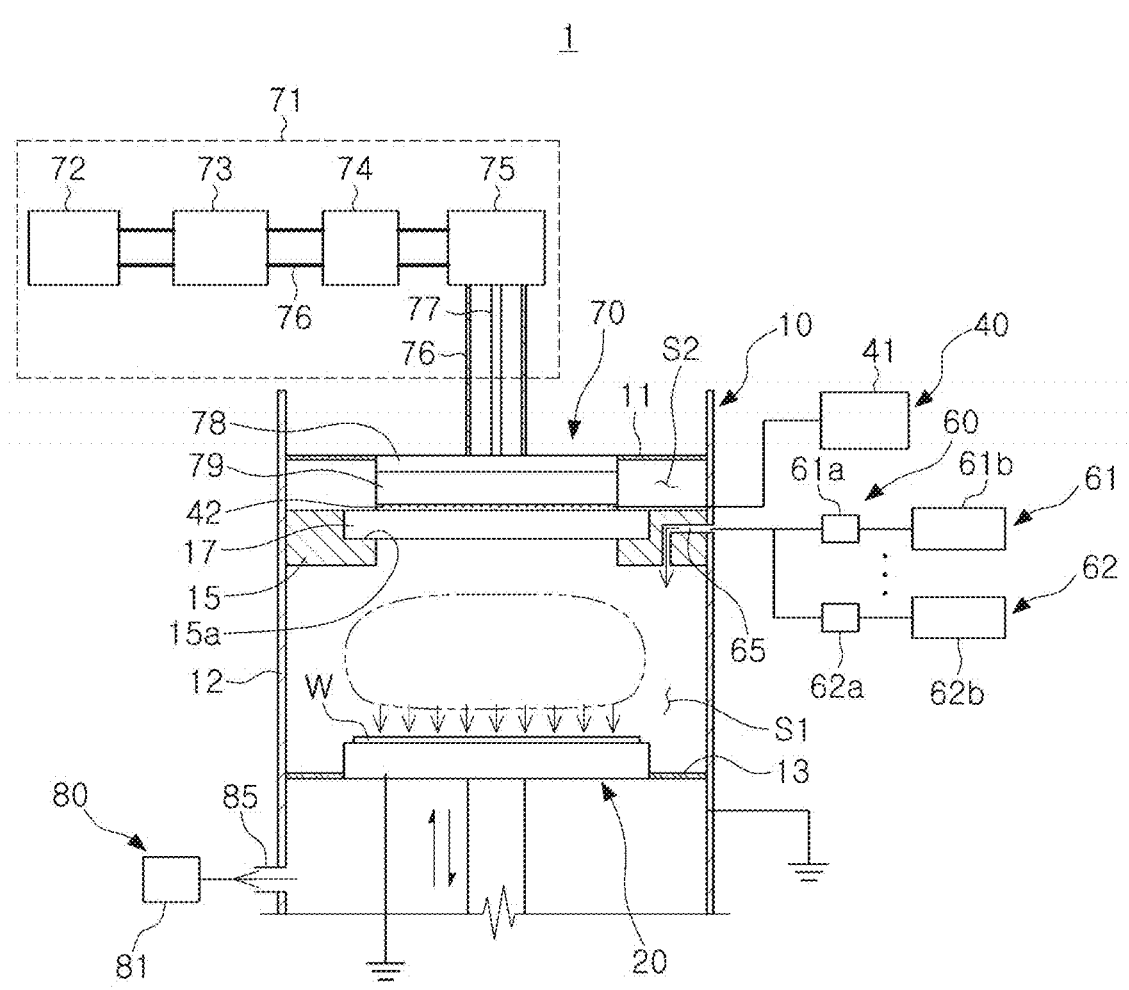
FIG. 4 is a schematic diagram illustrating performing of a first treatment condition adjustment and a first substrate treatment in the first exemplary embodiment in the present disclosure.
Figure 5:
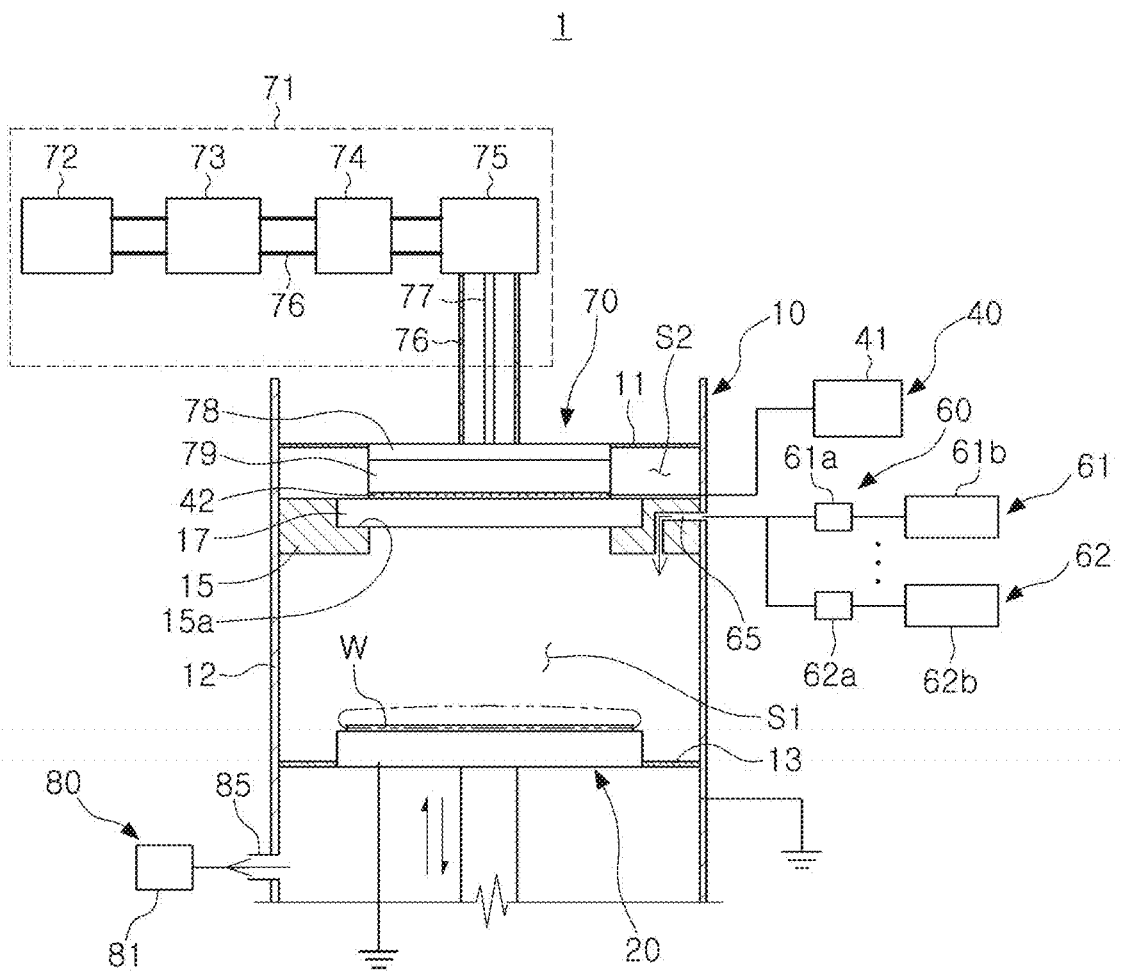
FIG. 5 is a schematic diagram illustrating performing of a second treatment condition adjustment and a second substrate treatment in the first exemplary embodiment in the present disclosure.

FIG. 3 is a flowchart of a substrate treating method according to an exemplary embodiment in the present disclosure, FIG. 4 is a schematic diagram illustrating performing of a first substrate treatment, and FIG. 5 is a schematic diagram illustrating performing of a second substrate treatment.

A substrate treating method according to an exemplary embodiment in the present disclosure uses the substrate treating apparatus 1 as shown in FIG. 1 and includes a substrate supplying operation (S100), a substrate treating operation (S200), and a substrate discharging operation (S300). The substrate treating operation (S200) includes a first treatment condition adjusting operation (S210), a first substrate treating operation (S220), a second treatment condition adjusting operation (S230), and a second substrate treating operation (S240), The operations are repeated as many times as necessary in cycles.

The substrate supply operation (S100) is an operation of supplying the substrate W to the inside of the treatment container 10 and placing the substrate W on the support member 20.

As schematically shown in FIG. 4, the first treatment condition adjusting operation (S210) is an operation of adjusting pressure of the treatment space S1 of the treatment container 10 and supplying a treatment gas to reform the substrate W with plasma. The first substrate treating operation (S220) is an operation of treating the substrate in the treatment space S, in which the treatment condition is adjusted, with plasma to modify the surface.

In the first treatment condition adjusting operation (S210), in order to treat the surface of the substrate W through plasma to reform the surface of the substrate, pressure in the treatment space S1 is adjusted to tens to hundreds of mm Torr so that plasma may be formed in the treatment space S1 by the plasma providing unit 40, and a reactive gas for plasma surface reforming is supplied to the gas supply unit 60. When adjusting is completed, the first substrate treating operation (S220) is performed.

In the first substrate treating operation (S220), the surface of the substrate W inside the treatment container 10 is reformed through the plasma providing unit 40. At this time, the microwave introducing unit 70 does not operate and only the plasma providing unit 40 operates. The first substrate treating operation (S220) terminates when a sufficient amount of time for the surface of the substrate to be reformed has elapsed, and the second treatment condition adjusting operation (S230) is performed.

Referring to FIG. 5, the second treatment condition adjusting operation (S230) is an operation of adjusting pressure and gas of the treatment space S1 because the first substrate treating operation (S220) and the second substrate treating operation (S240) are performed in one treatment container 10, and since the second substrate treating operation (S240) is an operation of heating and removing the reformed surface through plasma, pressure of the treatment space S1 is adjusted to a high vacuum or atmospheric pressure so that plasma may not be formed in the treatment space S1 by the microwave introducing unit 70, and a treatment gas is supplied through the gas supply unit 60.

Meanwhile, when the second treatment condition adjusting operation (S230) is performed, the second substrate treating operation (S240) is performed. In the second substrate treating operation (S240), the reformed substrate surface is heated to remove the reformed surface layer, and accordingly, atomic layer removal may be achieved. If necessary, the operations from the first treatment condition adjusting operation (S210) to the second substrate treating operation (S240) may be repeatedly performed in cycles, and the number of times of execution may be changed according to the degree to which atomic layer removal is required. The substrate discharging operation (S300) is an operation of discharging the substrate W seated on the support member 20 from the inside of the treatment container 10 to the outside of the treatment container 10 through a robot (not shown).

Since the substrate treating method according to the present exemplary embodiment performs two processing steps in one substrate treating apparatus 1, there is no need to move the substrate W from one substrate treating apparatus to another substrate treating apparatus through a robot. In addition, before the first substrate treating operation (S220) and the second substrate treating operation (S240), the first treatment condition adjusting operation (S210) and the second treatment condition adjusting operation (S230) are performed so that the two processing steps may be performed on the substrate W.

Figure 6:
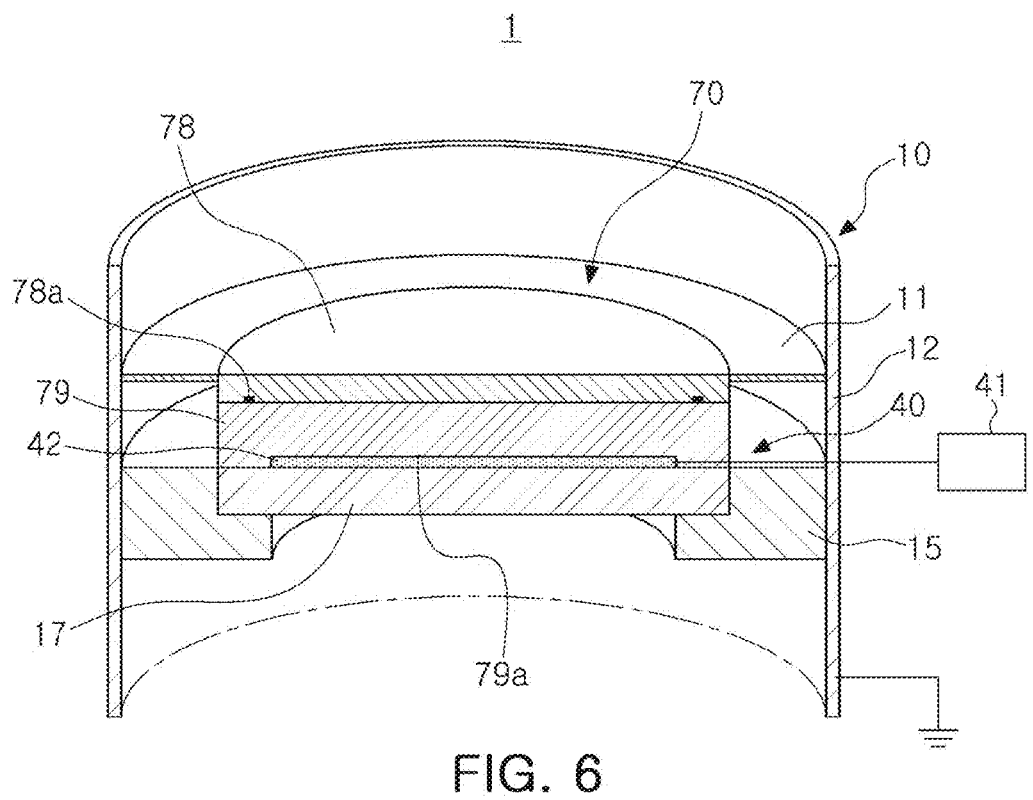
FIG. 6 is a schematic diagram of a substrate treating apparatus according to a second exemplary embodiment in the present disclosure.

FIG. 6 shows a schematic diagram of the substrate treating apparatus 1 according to a second exemplary embodiment in the present disclosure.

In the case of the second exemplary embodiment of FIG. 6, a basic configuration is the same as that of the first exemplary embodiment of FIG. 1, and thus, the description of the first exemplary embodiment may be applied to components not described in the present exemplary embodiment.

The substrate treating apparatus 1 according to the second exemplary embodiment in the present disclosure includes the treatment container 10 in which the substrate W is accommodated, the support member 20 (refer to FIG. 1) supporting the substrate W within the treatment container 10, the plasma providing unit 40 including the electrode 42 forming plasma in the treatment container 10, and the microwave introducing unit 70 connected to the microwave generating unit 71 (refer to FIG. 1) and introducing microwaves into the treatment container 1.

The treatment container 10 includes the upper surface 11 formed of a metal material that reflects microwaves, the side surface 12, and the baffle 13 (refer to FIG. 1), and is grounded. A space through which microwaves cannot escape is formed by the microwave antenna 78, the upper surface 11, the side surface 12, and the baffle 13 of the treatment container 10.

The treatment container 10 includes a ring-shaped support frame 15 disposed to protrude from the side surface 12 in a position higher than the substrate, and the transmission window 17 is disposed in the support frame 15. An upper surface of the support frame 15 and an upper surface of the transmission window 17 may be disposed to be coplanar.

The electrode 42 of the plasma providing unit 40 is disposed on the upper surface of the transmission window 17. The electrode 42 is connected to the RF generator 41, which is a power source, and the electrode 42 may be a transparent electrode transmitting at least a portion of microwaves.

The electrode 42 is disposed in a recess 79a of the insulator 79 and is covered by the insulator 79 and the transmission window 17 to be electrically insulated from other components.

The microwave antenna 78 of the microwave introducing unit 70 is disposed on an upper surface of the insulator 79. In the second exemplary embodiment, the microwave antenna 78 has the same disk shape as in the first exemplary embodiment, and includes a slot 78a. However, the microwave antenna 78 of the second exemplary embodiment is formed to be larger than an area of the electrode 42. That is, the microwave antenna 78 may have the same center as that of the electrode 42, but a diameter of the microwave antenna 78 may be larger than that of the electrode 42. Accordingly, since the microwave antenna 78 has an area not covered by the electrode 42 downwardly, heating of the substrate W (refer to FIG. 1) through the microwave antenna 78 may be facilitated.

An outer periphery of the microwave antenna 78 may be in contact with the upper surface 11, the microwave antenna 78 may be grounded through the treatment container 10, and the microwave antenna 78 may be electrically insulated from the electrode 42 by the insulator 79. The same configuration as that of the exemplary embodiment of FIG. 1 may be applied to the microwave generating unit 71 (refer to FIG. 1) connected to the microwave antenna 78 in the microwave introducing unit 70.

In the case of the second exemplary embodiment, the microwave antenna 78 is formed to be larger than the electrode 42 compared to the first exemplary embodiment, so this may be advantageous to heat the substrate W through the microwave antenna 78, and the insulator 79 covers the electrode 42 is covered as a whole, so that insulation between the electrode 42 and the microwave antenna 78 is more reliable.

Figure 7:
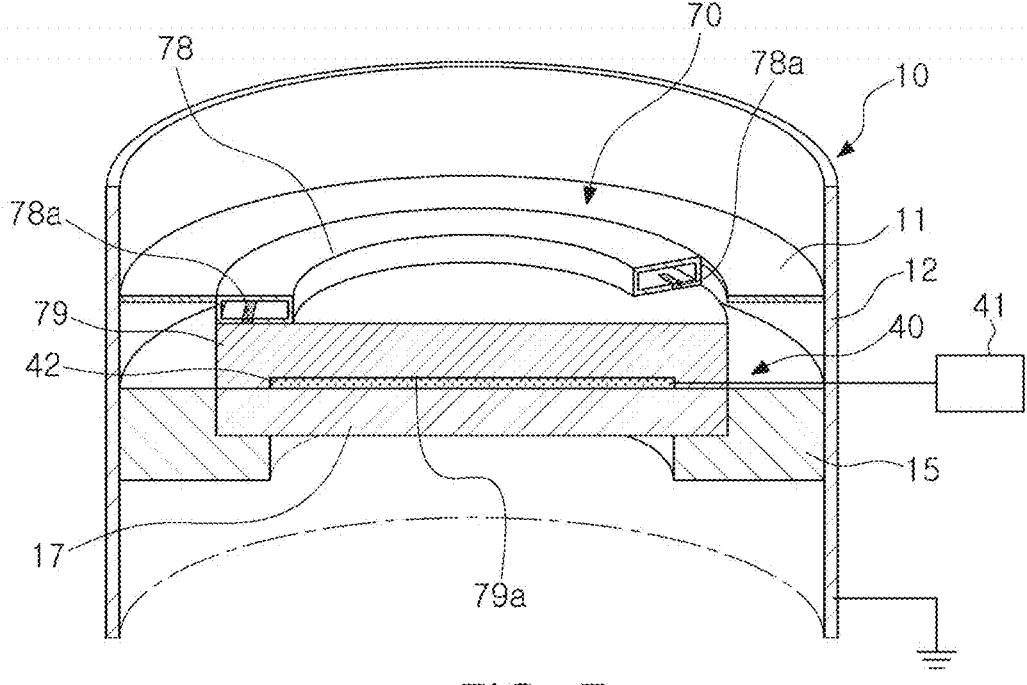
FIG. 7 is a schematic diagram of a substrate treating apparatus according to a third exemplary embodiment in the present disclosure.

FIG. 7 shows a schematic diagram of a third exemplary embodiment in the present disclosure.

The third exemplary embodiment is the same as the second exemplary embodiment except for the configuration of the microwave introducing unit 70, and thus, different components will be mainly described.

In the third exemplary embodiment, the microwave introducing unit 70 includes an annular microwave antenna 78 connected to a waveguide 76 (refer to FIG. 1). In the present exemplary embodiment, the microwave antenna 78 is bent from the waveguide 76 and has a configuration connected to the waveguide 76 having a square cross-section. In the present exemplary embodiment, microwaves may propagate in TE 10 mode.

In the present disclosure, as long as microwaves may be introduced into the treatment space S1, the microwave antenna 78 may be variably applied, and the structure extending from the waveguide 76 as in the third exemplary embodiment, rather than the disk-shaped antenna 78 as in the first and second exemplary embodiments, may also be applied.

Even in the case of the third exemplary embodiment, an outer edge of the microwave antenna 78 in a radial direction is connected to the upper surface 11 of the treatment container 10, and the microwave antenna 78 is connected to the treatment container 10 and grounded as in other exemplary embodiments.

Figure 8A:
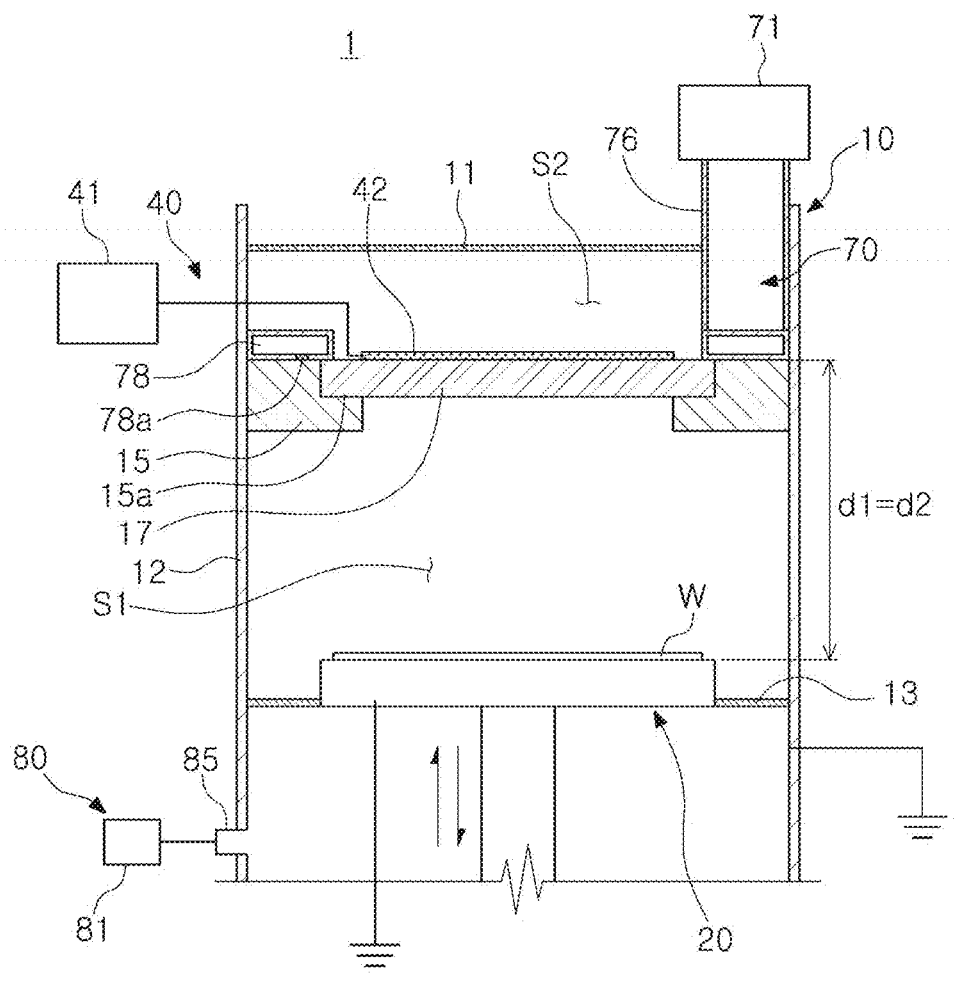
FIG. 8A is a schematic diagram of a substrate treating apparatus according to a fourth exemplary embodiment in the present disclosure.
Figure 8B:
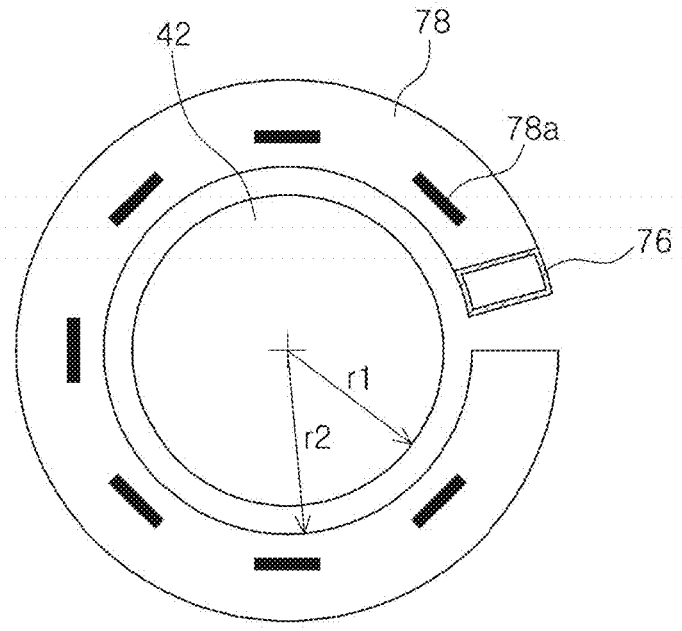
FIG. 8B is a plan view of a microwave antenna and a plasma electrode of the fourth exemplary embodiment.

FIG. 8A shows a schematic diagram of a fourth exemplary embodiment, and FIG. 8B shows a top plan view of the microwave antenna 78 and the electrode 42 in the fourth exemplary embodiment.

As shown in FIG. 8A, the substrate treating apparatus 1 according to the fourth exemplary embodiment in the present disclosure includes the treatment container 10 in which the substrate W is accommodated, the support member 20 supporting the substrate W in the treatment container 10, the plasma providing unit 40 including the electrode 42 forming plasma within the treatment container 10, the microwave generating unit 71, the microwave antenna 78 connected to the microwave generating unit 71 by the waveguide 76, and includes the microwave introducing unit 70 introducing microwaves into the treatment container 1, similarly to the first to third exemplary embodiments.

The treatment container 10 includes the upper surface 11, the side surface 12, and the baffle 13 to form the treatment space S1 in which processing is performed on the substrate W when the substrate W is accommodated, and is formed of a metal material so that microwaves may be reflected from the inside not to escape to the outside when the microwaves are introduced into the treatment container 10. The treatment container 10 may be connected to the microwave introducing unit 70 and is grounded, so that the microwave introducing unit 70 is grounded through the treatment container 10. In the present exemplary embodiment, the treatment container 10 contacts the microwave introducing unit 70 on the side 12.

The treatment container 10 has the support frame 15 connected to the side surface 12, and the support frame 15 has a hollow circular ring shape and includes a protrusion 15a so that the transmission window 17 is configured to be caught by the protrusion 15a, and the microwave antenna 78 of the microwave introducing unit 70 is disposed on an upper surface of the support frame 15. The support frame 15 is formed of a material through which the microwaves may pass.

The transmission window 17 supports the electrode 42 of the plasma providing unit 40 and is formed of a material through which microwaves may pass, similar to the support frame 15. In the present exemplary embodiment, an upper surface of the transmission window 17 and an upper surface of the support frame 15 are coplanar with each other. That is, a distance from the electrode 42 to the substrate W in a first direction, perpendicular to a treatment surface of the substrate W is the same as a distance from the microwave antenna 78 to the substrate W.

The support member 20 supports the substrate W inside the treatment container 10, has a size corresponding to the substrate W, and has a structure movable in a vertical direction. The baffle 13 of the treatment container 10 is disposed below the support member 20.

The plasma providing unit 40 includes the RF generator 41 as a power source and the electrode 42 connected to the RF generator 41. The electrode 42 of the plasma providing unit 40 is seated on the upper surface of the transmission window 17 above the substrate W, and is formed of a transparent electrode, for example, a material, such as indium tin oxide (ITO). The transparent electrode is conductive and allows a portion of the microwaves to be transmitted therethrough and another portion thereto to be reflected depending on film quality. Even if a portion of the microwaves is reflected by the electrode 42, the microwaves may be reflected by the metal microwave antenna 78 formed of a metal material, the upper surface 11, and the side surface 12 and provided to the treatment space S1. The electrode 42 is not limited to the transparent electrode, a metal electrode may also be used.

Although not shown in the fourth exemplary embodiment, the gas supply unit 60 (refer to FIG. 1) may be included as in the first exemplary embodiment, and since the same configuration may be applied, a detailed description thereof will be omitted.

The microwave introducing unit 70 includes the microwave generating unit 71 and the annular microwave antenna 78 connected to the microwave generating unit 71. In the present exemplary embodiment, microwaves generated by the microwave generating unit 71 are transmitted to the annular microwave antenna 78 and introduced into the treatment container 10 through the slot 78a formed in the microwave antenna 78. The microwave antenna 78 is formed in contact with the side surface 12 and is grounded through the side surface 12 formed of metal.

Meanwhile, as shown in FIG. 8B, when viewed from the first direction, perpendicular to the treatment surface of the substrate, a minimum diameter r2 of the microwave antenna 78 is greater than a maximum diameter r1 of the electrode 42, that is, a gap is formed between the microwave antenna 78 and the electrode 42. Due to the gap, the microwave antenna 78 and the electrode 42 may be electrically insulated. Therefore, the grounded microwave antenna 78 and the electrode 42 connected to the RF generator 41 may not affect each other.

In the present exemplary embodiment, since the gap is formed between the electrode 42 and the microwave antenna 78, the insulator 79 for electrical separation (refer to FIG. 1) may not be disposed, but if necessary, the insulator 79 may be disposed in the gap.

The upper space S2 is formed by the upper surface 11, the side surface 12, and the support frame 15 above the microwave antenna 78 and the electrode 42. The upper space S2 is formed to have a pressure at which plasma is not formed although microwaves are supplied by the microwave antenna 78.

Meanwhile, the discharge unit 80 through which gas is discharged is connected to a lower portion of the baffle 13 of the treatment container 10. The discharge unit 80 includes the discharge pipe 85 and the valve 81 allowing or blocking connection between the discharge pipe 85 and an exhaust system, and serves to discharge a treatment gas inside the treatment container 10 to the outside.

In the fourth exemplary embodiment of FIGS. 8A and 8B, the microwave antenna 78 and the electrode 42 are arranged not to overlap each other when viewed in the first direction, and accordingly, since the microwave antenna 78 and the electrode 42 are spaced apart from each other, arcing may not occur. Therefore, the electrode 42 and the microwave antenna 78 may be electrically separated without a separate insulator, and the configuration may be simplified.

Figure 9A:
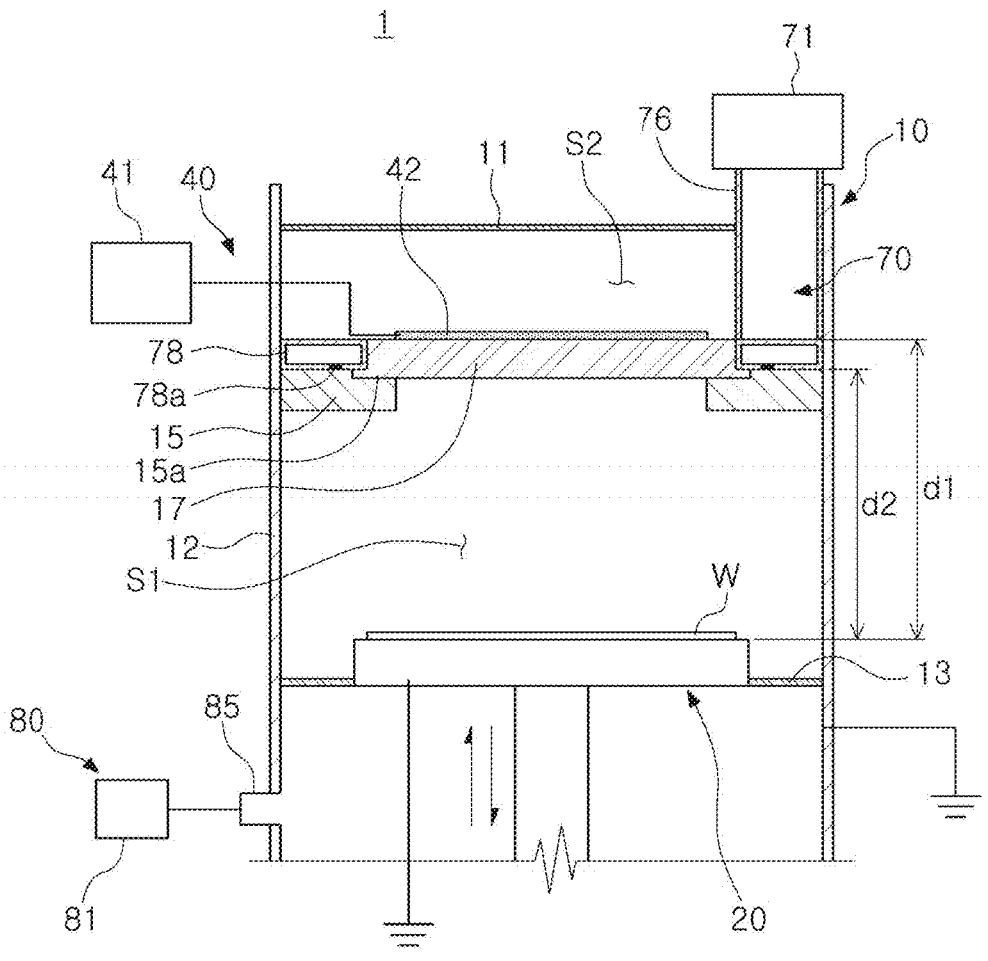
FIG. 9A is a schematic diagram of a substrate treating apparatus according to a fifth exemplary embodiment in the present disclosure.
Figure 9B:
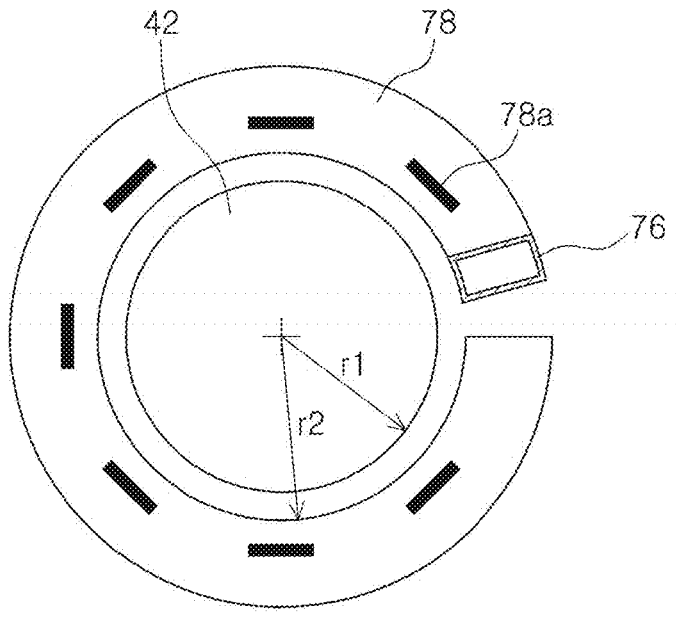
FIG. 9B is a plan view of a microwave antenna and a plasma electrode of the fifth exemplary embodiment.

FIG. 9A is a schematic diagram of a fifth exemplary embodiment, and FIG. 9B is a plan view of the microwave antenna 78 and the electrode 42 viewed in the first direction in the fifth exemplary embodiment.

In the case of the fifth exemplary embodiment, only the configuration of the microwave antenna 78, the electrode 42, and the transmission window 17 is different from that of the fourth exemplary embodiment, the different components will be mainly described and the other components are replaced with the description of the fourth exemplary embodiment to avoid redundancy.

In the fifth exemplary embodiment, the transmission window 17 is seated on the support frame 15, the microwave antenna 78 is disposed to surround the transmission window 17, and the upper surface of the transmission window 17 and the upper surface of the microwave antenna 78 are coplanar. Therefore, a distance d2 from the microwave antenna 78 to the substrate W in the first direction may be smaller than a distance d1 from the electrode 42 to the substrate W, and accordingly, the microwave antenna 78 and the electrode 42 may be naturally spaced apart from each other and may be electrically separated through the transmission window 17. Therefore, electrical separation may be reliably performed even without an additional insulator. In addition, since the connection between the electrode 42 and the RF generator 41 is also naturally separated from the microwave antenna 78, the configuration of the plasma providing unit 40 electrically separated from the microwave introducing unit 70 may be facilitated.

Figure 10:
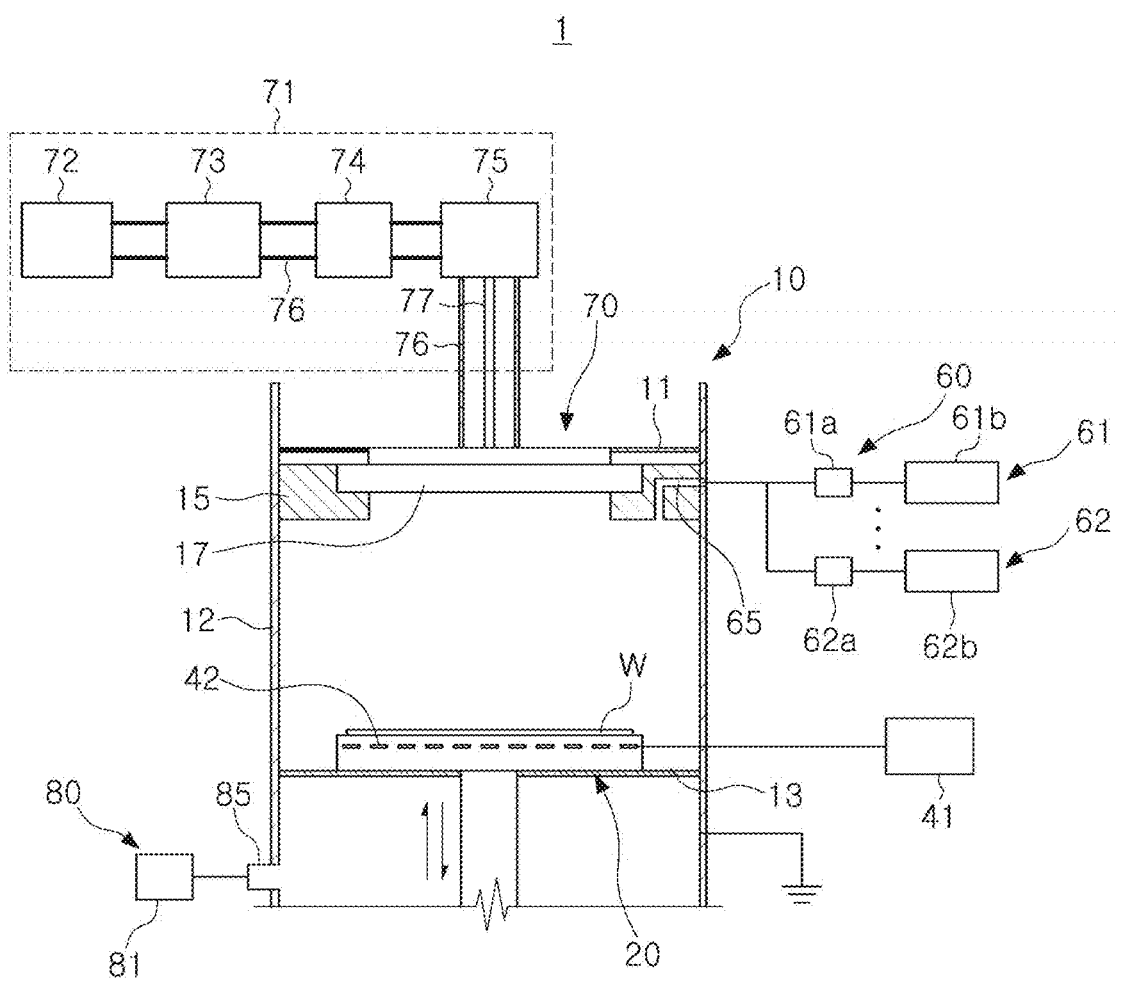
FIG. 10 is a schematic diagram of a substrate treating apparatus according to a sixth exemplary embodiment in the present disclosure.

In the case of the present disclosure, since atomic layer reforming of the substrate W through plasma and atomic layer removal through heating of the substrate W through microwaves are performed, it may be advantageous for the electrode 42 of the plasma providing unit 40 to be located above the substrate W, but the present disclosure does not exclude a structure in which the electrode 42 is located below the substrate W, that is, in the support member 20, for plasma reforming, and if necessary, the plasma providing unit 40 in which the electrode 42 is inserted into the support member 20 may be applied, and this configuration is shown in FIG. 10.

FIG. 10 is a schematic diagram of a sixth exemplary embodiment in the present disclosure, which is the same as the first exemplary embodiment except that the electrode 42 is located within the support member 20 of the substrate W, rather than above the substrate W. In the case of the sixth exemplary embodiment, the electrode 42 may be referred to as a lower electrode in that the electrode 42 is located below the substrate W.

The present disclosure may provide the substrate treating apparatus and method capable of providing heating and plasma treatment of a substrate in one device through the above configuration, and thus, atomic layer etching may be applied to mass production.

While example exemplary embodiments have been shown and described above, it will be apparent to those skilled in the art that modifications and variations could be made without departing from the scope of the present disclosure as defined by the appended claims.

What is claimed is:

1. A substrate treating apparatus comprising:
a treatment container in which a substrate is accommodated;
a support member supporting the substrate in the treatment container;
a plasma providing unit including an electrode generating plasma within the treatment container, and the electrode being an upper electrode that is located above the substrate in the treatment container, is connected to a power source and is transparent; and
a microwave introducing unit connected to a microwave generating unit and introducing microwaves into the treatment container,
wherein:
the microwave introducing unit includes a microwave antenna, a waveguide, and a waveguide shaft connected to the microwave antenna,
the microwave antenna has a disk shape, an outer edge of the microwave antenna in a radial direction is connected to the treatment container to be grounded, and the microwave antenna is disposed to be spaced apart from the upper electrode of the plasma providing unit and is located above the upper electrode, and a plurality of slots are formed in the microwave antenna, the substrate treating apparatus further comprising:

an insulator formed of a microwave transmissive material and disposed between the upper electrode and the microwave antenna, and a transmission window formed of the microwave transmissive material and disposed below the upper electrode, and the upper electrode being seated on the transmission window.

2. The substrate treating apparatus of claim 1, wherein a diameter of the microwave antenna is larger than a diameter of the upper electrode.

3. The substrate treating apparatus of claim 1, wherein the treatment container includes an upper surface, a side surface, a baffle, and a support frame protruding inwardly from the side surface, and the transmission window is at least partially supported on the support frame.

4. A substrate treating apparatus comprising:

a treatment container in which a substrate is accommodated;

a support member supporting the substrate in the treatment container;

a plasma providing unit including an electrode disposed above the substrate and connected to a power source to form plasma in the treatment container;

a microwave introducing unit connected to a microwave generating unit and including a microwave antenna that introduces microwaves into the treatment container;

a gas supply unit introducing gas into the treatment container;

a discharge unit discharging the gas inside the treatment container; and an insulator formed of a microwave transmissive material and disposed above the electrode, wherein:

the treatment container includes an upper surface, a side surface, a baffle, and a support frame protruding inwardly from the side surface, a transmission window is at least partially supported on the support frame, allows the electrode to be seated on an upper surface of the transmission window, and is formed of the microwave transmissive material, the microwave antenna is disposed to be spaced apart from the electrode above the substrate and is seated on the insulator above the electrode, the microwave antenna has a ring shape and includes a plurality of slots, and the microwave antenna is connected to the microwave generating unit through a waveguide.

5. The substrate treating apparatus of claim 4, wherein:

the electrode is a transparent electrode, the insulator and the transmission window include quartz, the support frame includes ceramic, and the support frame and the gas supply unit are connected.

6. The substrate treating apparatus of claim 4, wherein the ring shape of the microwave antenna surrounds the transmission window, and a distance from the microwave antenna to the substrate in a first direction, perpendicular to a treatment surface of the substrate, is shorter than a distance from the electrode to the substrate in the first direction.

7. The substrate treating apparatus of claim 4, wherein the plurality of slots are formed in a circumferential direction on a lower surface of the microwave antenna.

8. The substrate treating apparatus of claim 4, wherein a first distance from the microwave antenna to the substrate in a first direction, perpendicular to a treatment surface of the substrate, is identical to a second distance from the electrode to the substrate in the first direction.

9. A substrate treating apparatus comprising:

a treatment container in which a substrate is accommodated;

a support member supporting the substrate in the treatment container;

a plasma providing unit including an electrode disposed above the substrate and connected to a power source to form plasma in the treatment container;

a microwave introducing unit connected to a microwave generating unit and including a microwave antenna that introduces microwaves into the treatment container;

a gas supply unit introducing gas into the treatment container;

a discharge unit discharging the gas inside the treatment container; and an insulator formed of a microwave transmissive material and disposed above the electrode, wherein:

the treatment container includes an upper surface, a side surface, a baffle, and a support frame protruding inwardly from the side surface, a transmission window is at least partially supported on the support frame, allows the electrode to be seated on an upper surface of the transmission window, and is formed of the microwave transmissive material, the microwave antenna is disposed to be spaced apart from the electrode above the substrate and is seated on the insulator above the electrode, the microwave antenna has a disk shape and includes a plurality of slots, and an outer edge of the microwave antenna in a radial direction is grounded in contact with the upper surface of the treatment container.

* * * * *